United States Patent
Li et al.

(10) Patent No.: US 10,700,640 B2
(45) Date of Patent: Jun. 30, 2020

(54) HARMONIC-BASED NONLINEARITY FACTORIZATION SCHEME TO FACILITATE UP-CONVERSION MIXER LINEARITY

(71) Applicant: The Regents of the University of California, Oakland, CA (US)

(72) Inventors: Jinbo Li, Davis, CA (US); Qun Gu, Davis, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 16/432,668

(22) Filed: Jun. 5, 2019

(65) Prior Publication Data
US 2019/0379328 A1    Dec. 12, 2019

Related U.S. Application Data

(60) Provisional application No. 62/683,234, filed on Jun. 11, 2018.

(51) Int. Cl.
| | |
|---|---|
| H03F 3/45 | (2006.01) |
| H04B 1/26 | (2006.01) |
| H04B 1/28 | (2006.01) |
| H03D 7/12 | (2006.01) |
| H04B 1/04 | (2006.01) |
| G06F 30/30 | (2020.01) |

(52) U.S. Cl.
CPC ............ *H03D 7/125* (2013.01); *G06F 30/30* (2020.01); *H03F 3/45192* (2013.01); *H04B 1/0475* (2013.01); *H03D 2200/0033* (2013.01); *H03D 2200/0088* (2013.01); *H03F 2200/129* (2013.01); *H03F 2200/451* (2013.01); *H03F 2203/45116* (2013.01); *H04B 2001/0433* (2013.01); *H04B 2001/0491* (2013.01)

(58) Field of Classification Search
CPC combination set(s) only.
See application file for complete search history.

(56) References Cited

U.S. PATENT DOCUMENTS

| | | | |
|---|---|---|---|
| 5,642,071 A * | 6/1997 | Sevenhans ........... | H03D 7/1433 327/103 |
| 7,218,163 B2 * | 5/2007 | Hanke .................. | H03D 7/1441 327/358 |

(Continued)

*Primary Examiner* — An T Luu
(74) *Attorney, Agent, or Firm* — Park, Vaughan, Fleming & Dowler LLP

(57) ABSTRACT

The disclosed embodiments relate to the design of a system that implements an up-conversion mixer. This system includes a regulator-based linearized transconductance ($g_m$) stage, which converts a differential intermediate frequency (IF) voltage signal into a corresponding pair of IF currents. It also includes a pair of current mirrors, which duplicates the pair of IF currents into sources of a set of switching transistors. The set of switching transistors uses a differential local oscillator (LO) signal to gate the duplicated pair of IF currents to produce a differential radio frequency (RF) output signal. Finally, a combination of capacitors and/or inductors is coupled to common source nodes of the set of switching transistors to suppress higher order harmonics in an associated common source node voltage signal.

5 Claims, 10 Drawing Sheets

(56) References Cited

U.S. PATENT DOCUMENTS

| | | | |
|---|---|---|---|
| 7,514,981 B2* | 4/2009 | Yang | H03D 7/1441 |
| | | | 327/355 |
| 7,773,969 B2* | 8/2010 | Simon | H03F 1/3211 |
| | | | 327/359 |
| 8,190,117 B2* | 5/2012 | Mitomo | H03D 7/1441 |
| | | | 455/118 |
| 2004/0174199 A1* | 9/2004 | Simon | G06G 7/163 |
| | | | 327/256 |

* cited by examiner

HARMONIC-BASED NONLINEARITY FACTORIZATION SCHEME TO FACILITATE UP-CONVERSION MIXER LINEARITY

CROSS-REFERENCE TO RELATED APPLICATION

This application claims the benefit of U.S. Provisional Patent Application Ser. No. 62/683,234, entitled "Harmonic-Based Nonlinearity Factorization Scheme to Facilitate Up-Conversion Mixer Switching Linearity," by inventors Jinbo Li and Qun Gu, filed on 11 Jun. 2018, the contents of which are incorporated by reference herein.

GOVERNMENT LICENSE RIGHTS

This invention was made with U.S. government support under grant number N00014-14-1-0257 awarded by the Office of Naval Research (ONR). The U.S. government has certain rights in the invention.

BACKGROUND

Field

The disclosed embodiments generally relate to the design of high-performance circuits to support wireless communication. More specifically, the disclosed embodiments relate to a harmonic-based nonlinearity factorization technique, which can be used to improve linearity in up-conversion mixers for wireless transmitters.

Related Art

Increasing data rates in wireless communication systems are making it necessary to optimize the performance of data-transmission circuits. In particular, up-conversion mixers are a critical component in wireless data-transmission systems. Up-conversion mixers are used to modulate a baseband signal containing data-to-be-transmitted onto a carrier frequency, which is broadcast through space or other media to one or more receivers.

It is important for up-conversion mixers not to constrain the transmitter linearity, especially for high frequency power amplifiers in which high gain is costly. This mandates stringent linearity requirements for the up-conversion mixer. Up-conversion mixer nonlinearities arise from two main sources: (1) a nonlinear transconductance $g_m$ stage that generates intermodulation products when converting an input voltage to a current; and (2) nonlinearities generated by the local oscillator (LO) switching pair during the process of frequency translation.

Hence, what is needed is a technique for optimizing the design of an up-conversion mixer by reducing nonlinearities that affect mixer performance.

SUMMARY

The disclosed embodiments relate to the design of a system that implements an up-conversion mixer. This system includes a regulator-based linearized transconductance ($g_m$) stage, which converts a differential intermediate frequency (IF) voltage signal into a corresponding pair of IF currents. It also includes a pair of current mirrors, which duplicates the pair of IF currents into sources of a set of switching transistors. The set of switching transistors uses a differential LO signal to gate the duplicated pair of IF currents to produce a differential radio frequency (RF) output signal. Finally, a combination of capacitors and/or inductors is coupled to common source nodes of the set of switching transistors to suppress higher order harmonics in an associated common source node voltage signal.

In some embodiments, the regulator-based linearized $g_m$ stage uses a folded telescopic amplifier to linearize one or more $g_m$ transistors, thereby making the effective $g_m$ of the regulator-based linearized $g_m$ stage only dependent on a load resistor.

In some embodiments, the system also includes a transformer, which loads the set of switching transistors and converts the differential RF output signal into a single-ended RF output signal.

In some embodiments, the suppressed higher order harmonics primarily comprise even harmonics.

In some embodiments, the combination of capacitors and/or inductors comprises a pair of harmonic-nulling capacitors.

In some embodiments, the combination of capacitors and/or inductors includes a shunt-resonance network, which cancels parasitic capacitances on the common source nodes.

The disclosed embodiments also relate to a computer-aided design system that designs an up-conversion mixer. During execution, the computer-aided design system analyzes a switching pair of transistors for the up-conversion mixer, wherein the switching pair uses an LO signal to gate an IF input current to produce an RF output current for the up-conversion mixer. While analyzing the switching pair, the system represents the conversion of the IF input current into a common-mode source voltage for the switching pair as a nonlinear time-varying function H1, expressed as a Taylor series expansion, wherein the coefficients are expressed as a series of LO harmonics via Fourier transform. It also represents a conversion of the common-mode source voltage into the RF output current as a nonlinear time-varying function H2, expressed as a Taylor series expansion, wherein the coefficients are expressed as a series of LO harmonics via Fourier transform. Next, the system expands H1 into a two-dimensional (2D) representation which relates different powers and different harmonics. It also expands H2 into a 2D representation which relates different powers and different harmonics. The system then cascades the 2D representations of H1 and H2 to generate a set of third-order intermodulation distortion (IMD3) factors, wherein the coefficients of the 2D representation of H2 are applied to terms of H1 to generate the IMD3 factors. Finally, the system designs reactive components for the common source node of the switching pair based on the determined IMD3 factors.

In some embodiments, the IMD3 factors include: (1) up-conversion factors associated with an up-conversion of a low-frequency portion of the common-source node voltage; and (2) down-conversion factors associated with a down-conversion of a high-frequency portion of the common-source node voltage.

In some embodiments, the down-conversion factors can dominate performance of the IMD3 factors at some frequencies.

In some embodiments, the high-frequency portion of the common-source node voltage primarily comprises even LO harmonics.

In some embodiments, the set of IMD3 factors comprises six most-critical IMD3 factors.

In some embodiments, the reactive components for the common-source node of the switching pair include a combination of capacitors and/or inductors.

In some embodiments, the combination of capacitors and/or inductors includes a pair of harmonic-nulling capacitors.

In some embodiments, the combination of capacitors and/or inductors operates to cancel parasitic capacitances on the common source nodes.

In some embodiments, the combination of capacitors and/or inductors includes a shunt resonance network.

In some embodiments, the combination of capacitors and/or inductors includes high-order reactive networks that operate on even LO harmonics to improve linearity.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Details

Figure 1:
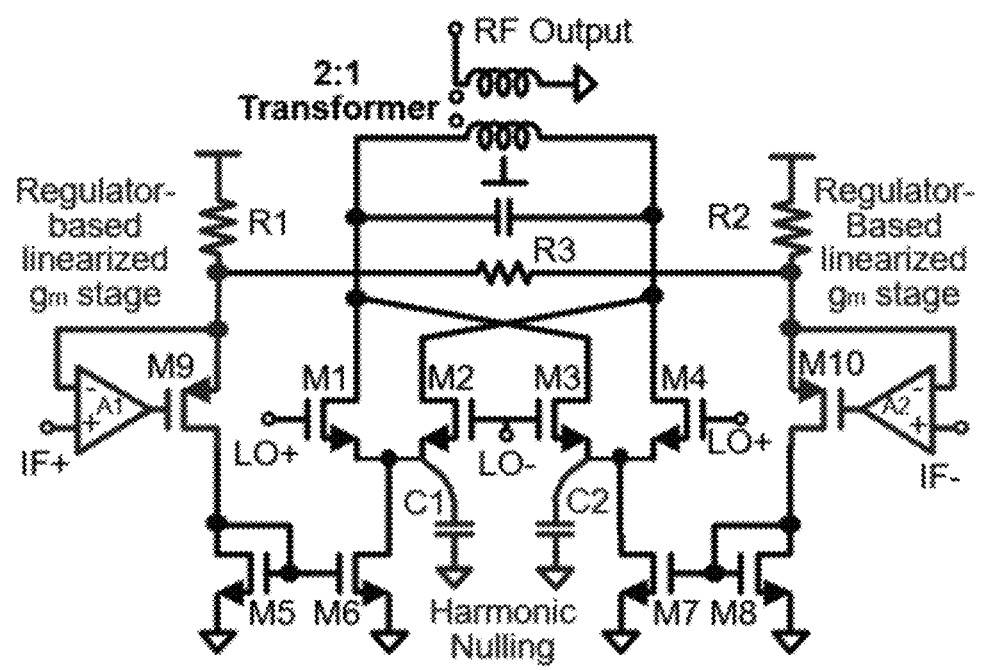
FIG. 1 illustrates a schematic of an up-conversion mixer core with a regulator-based $g_m$ stage and harmonic nulling of the LO switching transistors in accordance with the disclosed embodiments.

The disclosed embodiments provide a highly linear up-conversion mixer. This up-conversion mixer includes a regulator-based linearized transconductance $g_m$ stage, which is adopted for linear voltage-to-current conversion. It also uses a harmonic-nulling technique to suppress even harmonics of the switching transistor pairs, thereby improving their linearity performance. FIG. 1 illustrates a schematic of the up-conversion mixer core, which includes a regulator-based $g_m$ stage and provides harmonic nulling at common source nodes of the LO switching transistors. The regulator-based linearized $g_m$ stage converts the input IF voltage into corresponding current. Next, a current mirror comprising transistor pairs M5-M6 and M7-M8 duplicate the current into the switching transistors M1-M4. Transistors M1-M4 then steer the currents and convert them to a desired RF frequency band. Note that harmonic-nulling capacitors C1 and C2 are placed at the common source node of switching transistors M1-M2 and M3-M4, respectively, to suppress the even harmonics.

A 2:1 transformer loads the switching transistors and converts the differential signals to single-ended signals to drive an external 50Ω load. Note that the selection of the 2:1 turning ratio is made based on a tradeoff between low coupling loss and high output impedance. This mixer operates in a current-limited regime and preferably operates with a high output impedance for both high-conversion gain and good linearity performance. However, note that an output impedance that is too large will increase impedance-conversion loss. Hence, the 2:1 turning ratio provides a good design point with respect to these performance tradeoffs.

Regulator-Based Linearized $g_m$ Stage

Figure 2:
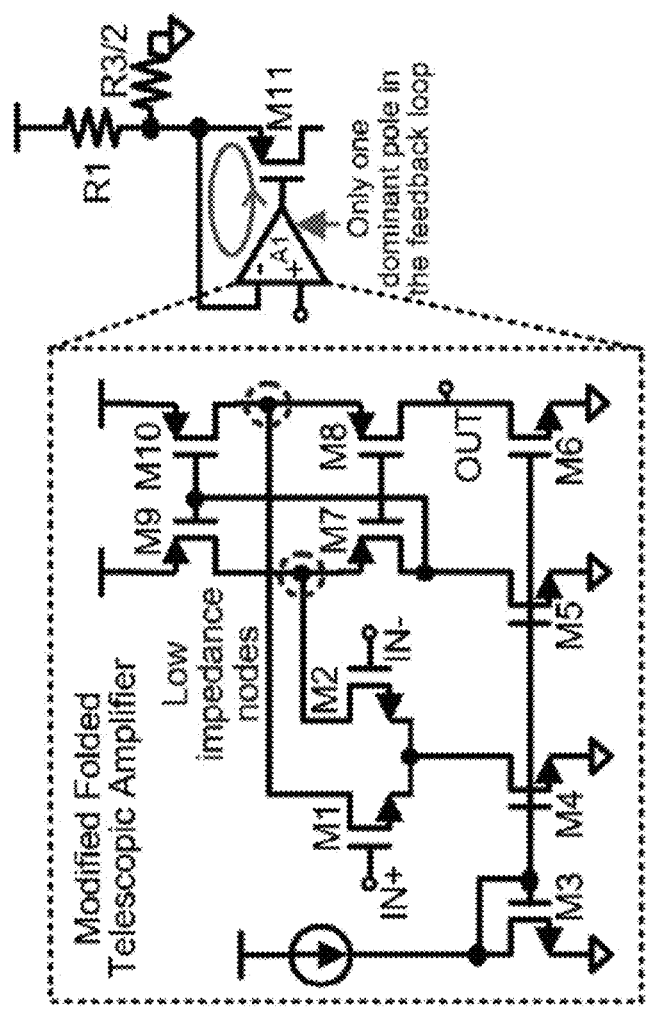
FIG. 2 illustrates a schematic of the regulator-based $g_m$ stage in accordance with the disclosed embodiments.

FIG. 2 illustrates a half-circuit schematic for the regulator-based linearized $g_m$ stage. Note that only half of resistor R3 from FIG. 1 is illustrated because the circuit deals with differential inputs so the center of resistor R3 can be regarded as the virtual ground. The regulator-based linearized $g_m$ stage uses amplifier A1 to form a negative feedback loop. Note that the amplifier A1 can be implemented using a modified telescopic amplifier and uses one pair of NMOS transistors M5 and M6 at the bottom of FIG. 2 to remove the voltage headroom consumed by the extra common-gate NMOS pair in conventional telescopic amplifiers, which provides a lower output voltage to drive PMOS transistor M9. As illustrated in FIG. 2, there is only one high impedance node (i.e., only one dominant pole) within the feedback loop to facilitate the stabilization of the loop. If the transconductance of transistor M11 is represented as $g_m$, and the amplifier gain as A, then the effective transconductance can be specified as follows.

$$G_{m,eff} = \frac{g_{mA}}{1 + (1+A)g_m\left(R_1 \| \frac{R_3}{2}\right)} \approx \frac{1}{R_1 \| \frac{R_3}{2}}$$

An approximation occurs when the loop gain is large ($Ag_mR_1\|0.5R_3 \gg 1$), which means that the effective transconductance only depends on the resistors. Note that the purpose of resistor $R_3$ is to provide another degree of freedom to adjust $G_{m,eff}$ without affecting the circuit DC conditions.

Harmonic-Nulling Technique

Figure 3:
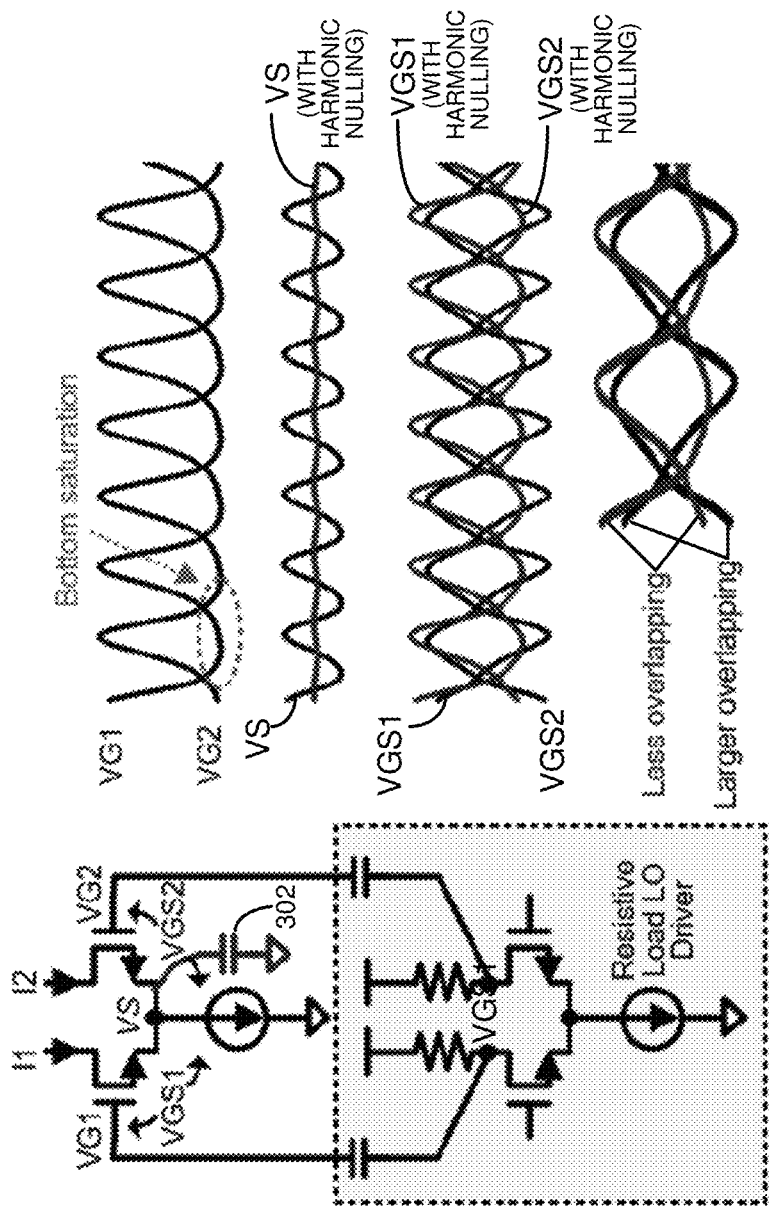
FIG. 3 illustrates a harmonic-nulling technique, which nulls the even harmonics, in accordance with the disclosed embodiments.

The nonlinearities of the LO switching transistors become significant during the transition region of the switching pairs in current-commutating mixers when both transistors are turned on. The proposed harmonic-nulling technique reduces the transition regions, and thereby greatly suppresses these nonlinearities from the LO switching transistors. These mechanisms are graphically illustrated in FIG. 3. In FIG. 3, when the mixer is driven by a resistive-load amplifier, the LO signal waveforms have bottom saturations. Because the common source node starts to track the larger one of VG1 and VG2 when the current is steered from one side to the other, even harmonics are forced on the common source node VS. Hence, the VGS1 and VGS2 waveforms have more overlapping areas as is shown in FIG. 3. Note that the induced current waveforms look similar, which indicates that the switching transistors are simultaneously on for a significant time within the LO signal period. By using the harmonic-nulling capacitor 302 to remove the even harmonics at the source node, VGS1 and VGS2 can be restored, thereby reducing the current overlapping area as well as the even LO harmonics on the common-source node. In this way, the nonlinearities of the LO switching transistors are greatly suppressed. Moreover, the reduction in the overlapping area also benefits the conversion gain, because less conversion gain can be achieved when the current is not steered fully.

Up-Conversion Mixer Design Methodology

The disclosed embodiments also provide a new design methodology for up-conversion mixers. This design methodology uses a new harmonic-based nonlinearity factorization scheme to analyze switching pair behavior in up-conversion mixers with low IF. During the analysis, the frequency response at each harmonic is considered constant in proximity to the harmonic frequencies. Also, closed-form expressions for signal gain and IMD3 are derived, and six key IMD3 contributors are identified. Moreover, the importance of the even harmonics of the common-source node voltage is validated.

Figure 4:
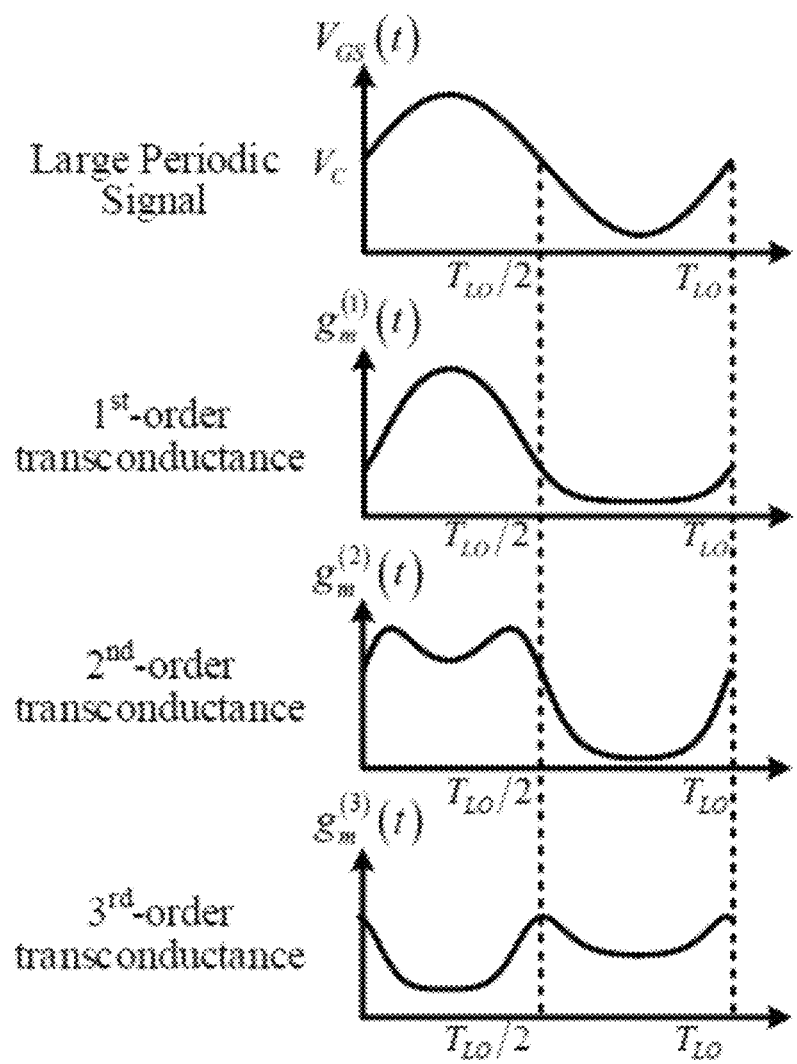
FIG. 4 illustrates typical small-signal responses for a CMOS transistor in accordance with the disclosed embodiments.

Up-conversion mixers operate by using pairs of switching transistors to modulate baseband signals onto a carrier frequency to facilitate broadcasting the signals through space or other media. Driven by a periodic LO signal, the switching pairs operate in a periodic steady state. At each instant, small-signal parameters, such as nonlinear transconductance, are set by the instantaneous DC state, as is illustrated in FIG. 4. (FIG. 4 illustrates typical small-signal responses for a CMOS transistor under a large gate-source voltage signal $V_{GS}(t)$ having a period $T_{LO}$, wherein $g_m^{(n)}(t)$ represents the $n^{th}$-order transconductance, and wherein the superscript (n) represents the $n^{th}$-order coefficient.) Note that reactive components in the up-conversion mixer circuit induce frequency dependent effects and thereby add complexity to the analysis. Thus, the three key components in mixer behavior are: (1) time-varying characteristics; (2) nonlinearity; and (3) frequency dependent effects.

Figure 5:
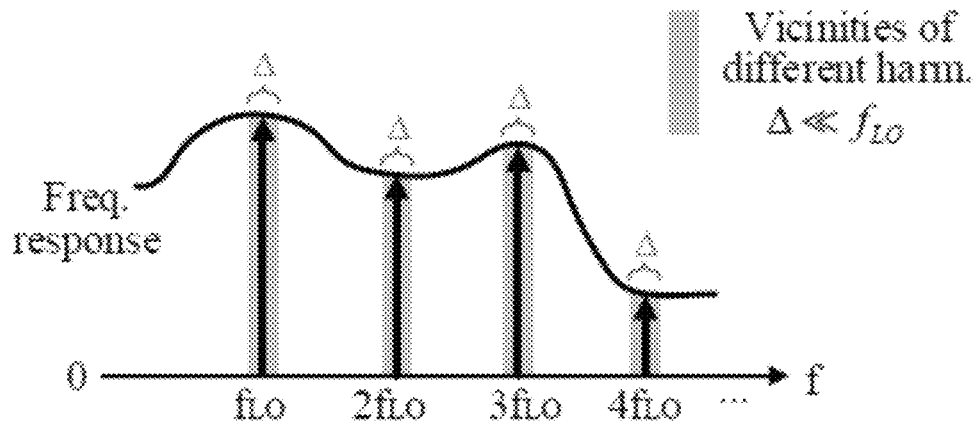
FIG. 5 illustrates the concept of harmonic-based analysis in accordance with the disclosed embodiments.

The up-conversion mixer circuit is analyzed by performing a harmonic-based analysis. The concept behind this harmonic-based analysis is illustrated in FIG. 5, wherein the frequency response of a circuit is decomposed into different LO harmonics. For up-conversion mixers with low IF, the frequency response in the vicinity of each harmonic can be approximated by that harmonic. This greatly simplifies the analysis of the reactive components because they exhibit nearly constant impedance in the neighborhood of each LO harmonic.

Figure 6:
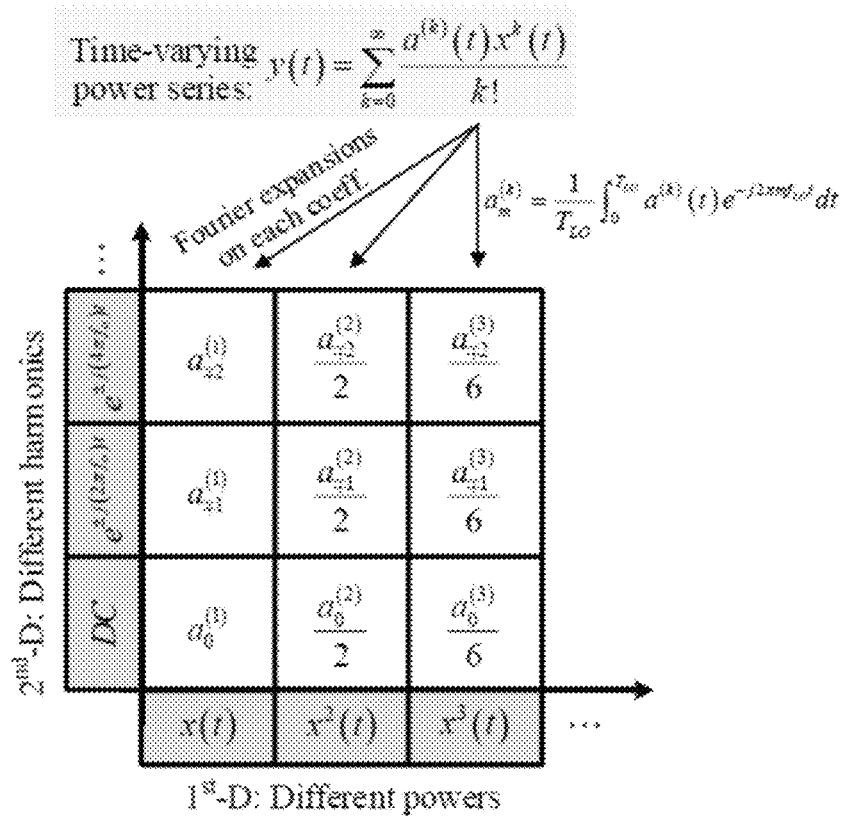
FIG. 6 illustrates a 2D example of y(t) as a periodically time-varying power series of x(t) in accordance with the disclosed embodiments.

Based on these harmonics, the time-varying nonlinearities, which can be expressed for example by y(t) in FIG. 6, are expanded in two dimensions. First, y(t) is expanded in a time-varying power series of the input variable x(t) using Taylor series expansions. Next, each of the time-varying coefficients $a^{(k)}(t)$ is expressed as a Fourier series of the frequency $f_{LO}$ as illustrated in the table in FIG. 6. Thus, if the analysis only focuses on a certain harmonic, the circuit is reduced to a quasi-time-invariant state without frequency dependent effects. (In this disclosure, superscript annotations in parentheses represent the order of the coefficients, and superscript annotations without parentheses simply indicate the power orders of the variable. Also, the subscript annotation represents the Fourier series coefficients, i.e., harmonics.)

Figure 7:
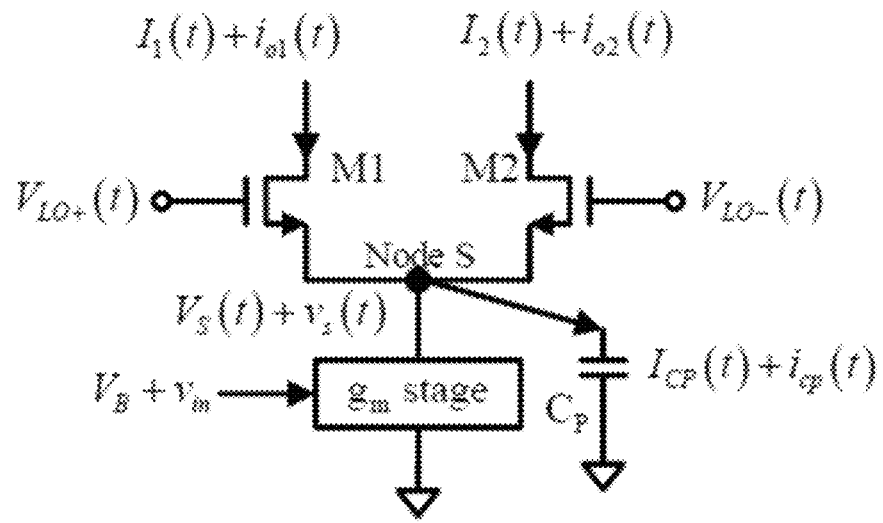
FIG. 7 illustrates a simplified mixer scheme in accordance with the disclosed embodiments.

FIG. 7 presents a simplified mixer core schematic with only one switching pair, wherein annotations in capital letters indicate large signals and annotations in small letters indicate small signals. In FIG. 7, the transistors M1 and M2 act as a switching pair, which is driven by differential periodic signals $V_{LO+}(t)$ and $V_{LO+}(t)$. Also, $C_P$ represents the total capacitance at the source node, including parasitic gate-source capacitances, source-bulk capacitors of M1 and M2, and parasitic capacitances on the $g_m$ stage.

Figure 8:
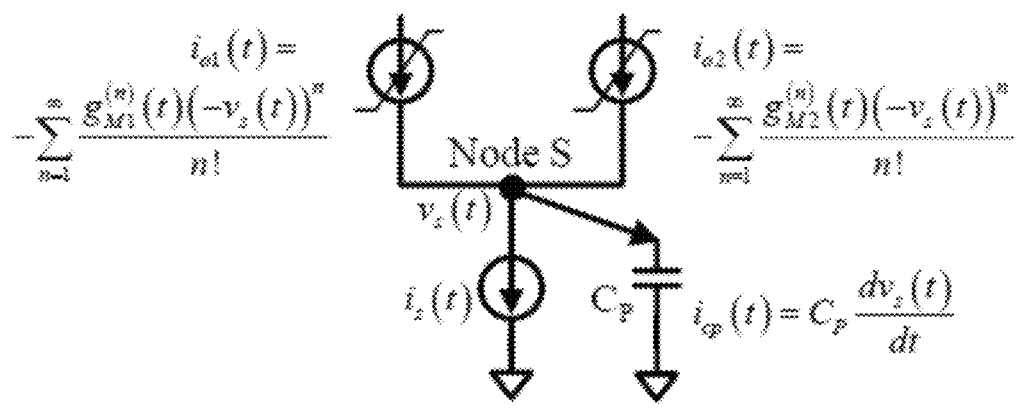
FIG. 8 illustrates an equivalent small-signal model in accordance with the disclosed embodiments.

FIG. 8 illustrates an equivalent small-signal model, wherein $g_{M1}^{(n)}(t)$ and $g_{M2}^{(n)}(t)$ represent $n^{th}$-order time-varying transconductances of transistors M1 and M2, respectively, and the output of the $g_m$ stage is represented as $i_s(t)$. In this model, two simplifying assumptions are made: (1) the gates of M1 and M2 are assumed to be at AC ground; and (2) the operating frequency of transistors M1 and M2 is assumed to be far below their unit current gain frequency, $F_T$. Hence, it is possible to ignore the gate leakage currents and the intermodulation distortions generated by the nonlinear capacitors. Note that as frequency increases, these two assumptions gradually become invalid.

Figure 9:
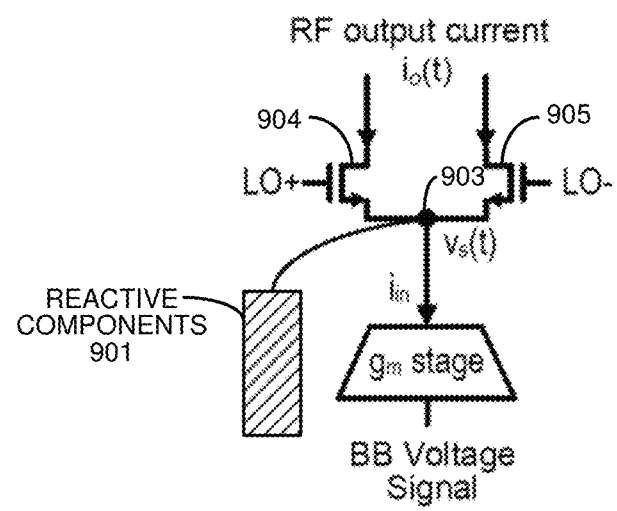
FIG. 9 illustrates a simplified switching pair in accordance with the disclosed embodiments.

Performance of the up-conversion mixer is optimized by adding specially designed reactive components to the common source nodes of the switching pairs to suppress higher order harmonics. For example, FIG. 9 illustrates a simplified switching pair, wherein specially designed reactive components 901 are attached to the common source node 903 of the switching pair comprising transistors 904-905.

Figure 10:
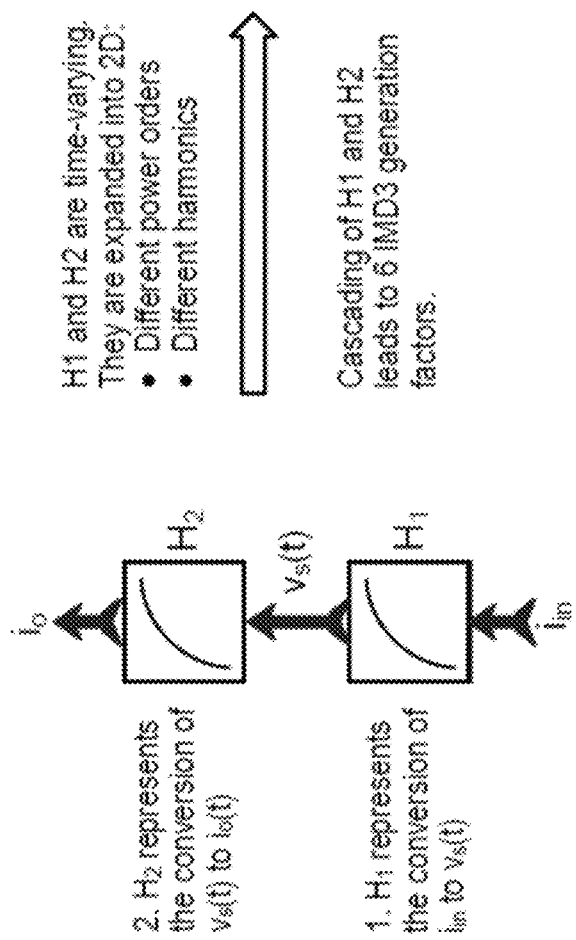
FIG. 10 illustrates a two-step process for performing a harmonic-based nonlinearity factorization technique that analyzes the behavior of switching pairs for an up-conversion mixer in accordance with the disclosed embodiments.

Referring to FIG. 10, reactive components 901 are designed using a two-step process involving a harmonic-based nonlinearity factorization analysis to determine the behavior of switching pairs in the up-conversion mixer. The first step H1 represents the conversion of an input current $i_{in}(t)$ into a common-mode source voltage of a switching pair $v_s(t)$. The second step H2 represents the conversion of $v_s(t)$ into an output current $i_o(t)$. During the analysis, H1 and H2 are cascaded to produce six IMD3 generation factors, which are used to design reactive elements 901 as is described in more detail below.

Process of Operation

Figure 11:
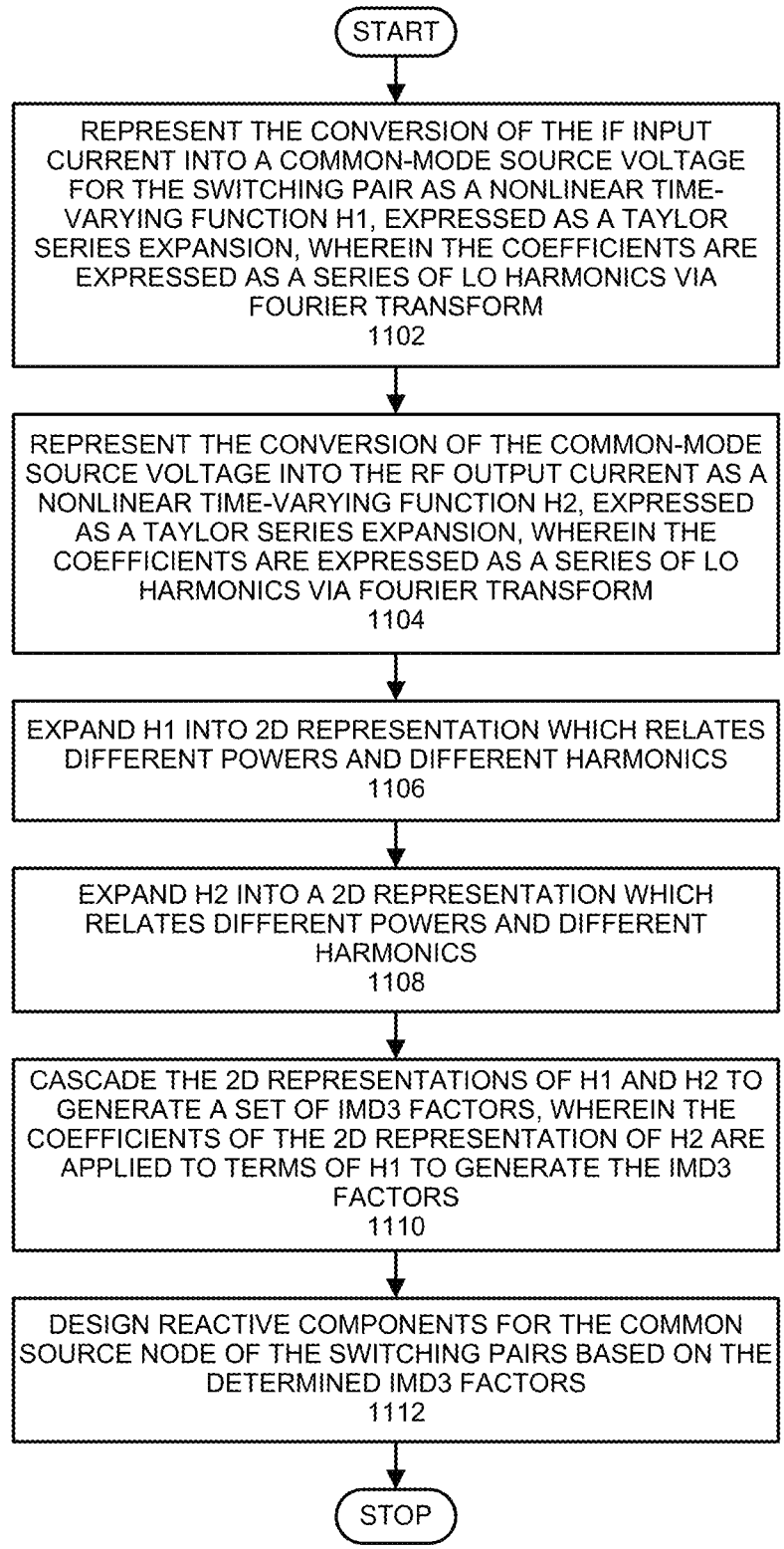
FIG. 11 presents a flow chart illustrating a process for analyzing behavioral characteristics of a switching pair in an up-conversion mixer in accordance with the disclosed embodiments.
Figure 12:
FIG. 12 illustrates a computer-aided design system, which can be used to design an up-conversion mixer, in accordance with the disclosed embodiments.

FIG. 11 presents a flow chart illustrating the operation of a system that designs reactive components for a switching pair in an up-conversion mixer, wherein the switching pair uses an LO signal to gate an IF input current to produce an RF output current for the up-conversion mixer. This system can be implemented within a computer-aided design system 1202 as is illustrated in FIG. 12. During operation, computer-aided design system 1202 receives design parameters for an up-conversion mixer 1204, and then uses these design parameters to produce an optimized design 1206 for the up-conversion mixer, which is suitable for fabrication.

While analyzing the switching pair, computer-aided design system 1202 represents the conversion of the IF input current into a common-mode source voltage for the switching pair as a nonlinear time-varying function H1, expressed as a Taylor series expansion, wherein the coefficients are expressed as a series of LO harmonics via Fourier transform (step 1102). It also represents the conversion of the common-mode source voltage into the RF output current as a nonlinear time-varying function H2, expressed as a Taylor series expansion, wherein the coefficients are expressed as a series of LO harmonics via Fourier transform (step 1104). Next, the system expands H1 into a 2D representation which relates different powers and different harmonics (step 1106). It also expands H2 into a 2D representation which relates different powers and different harmonics (step 1108). The system then cascades the 2D representations of H1 and H2 to generate a set of IMD3 factors, wherein the coefficients of the 2D representation of H2 are applied to terms of H1 to generate the IMD3 factors (step 1110).

Finally, the system designs reactive components for the common source nodes of the switching pairs based on the determined IMD3 factors (step 1112). For example, the reactive components can include harmonic-nulling capacitors and/or shunt inductors, wherein the capacitance and inductance parameters for these components can be adjusted to optimize linearity at the common source nodes of the switching pairs. This optimization process can be performed using any one of a number of known techniques for designing reactive components to optimize linearity.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An up-conversion mixer, comprising:
    a regulator-based linearized transconductance ($g_m$) stage, which converts a differential intermediate frequency (IF) voltage signal into a corresponding pair of IF currents;
    a pair of current mirrors, which duplicates the pair of IF currents into sources of a set of switching transistors;
    the set of switching transistors, which uses a differential local oscillator (LO) signal to gate the duplicated pair of IF currents to produce a differential radio frequency (RF) output signal;
    a combination of capacitors and/or inductors coupled to common source nodes of the set of switching transistors to suppress higher order harmonics in a common source node voltage signal for the set of switching transistors; and
    a transformer, which loads the set of switching transistors and converts the differential RF output signal into a single-ended RF output signal.

2. The up-conversion mixer of claim 1, wherein the regulator-based linearized $g_m$ stage uses a folded telescopic amplifier to linearize one or more $g_m$ transistors, thereby making an effective $g_m$ of the regulator-based linearized $g_m$ stage only dependent on a load resistor.

3. The up-conversion mixer of claim 1, wherein the suppressed higher order harmonics primarily comprise even harmonics.

4. The up-conversion mixer of claim 1, wherein the combination of capacitors and/or inductors comprises a pair of harmonic-nulling capacitors.

5. The up-conversion of claim 1, wherein the combination of capacitors and/or inductors includes a shunt-resonance network, which cancels parasitic capacitances on the common source nodes.

\* \* \* \* \*